United States Patent
America et al.

(10) Patent No.: US 6,875,688 B1
(45) Date of Patent: Apr. 5, 2005

(54) METHOD FOR REACTIVE ION ETCH PROCESSING OF A DUAL DAMASCENE STRUCTURE

(75) Inventors: William G. America, Kingston, NY (US); Kaushik A. Kumar, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,630

(22) Filed: May 18, 2004

(51) Int. Cl.$^7$ .................................... H01L 21/4763
(52) U.S. Cl. ............... 438/638; 438/624; 438/700; 438/702; 438/703; 438/712; 438/723; 438/724; 438/725; 438/736; 438/737; 438/738; 438/743; 438/744; 257/760
(58) Field of Search ....................... 438/638, 624, 438/700, 702, 703, 712, 723, 724, 725, 736, 737, 738, 743, 744; 257/760

(56) References Cited

U.S. PATENT DOCUMENTS

| | | | | |
|---|---|---|---|---|
| 5,635,423 A | * | 6/1997 | Huang et al. ............... | 438/638 |
| 6,436,810 B1 | * | 8/2002 | Kumar et al. ............... | 438/633 |
| 2002/0119654 A1 | * | 8/2002 | Fornof et al. ............... | 438/638 |
| 2003/0064582 A1 | * | 4/2003 | Oladeji et al. .............. | 438/638 |
| 2003/0119307 A1 | * | 6/2003 | Bekiaris et al. ............. | 438/638 |

OTHER PUBLICATIONS

Multilevel Wiring Technology for Leading–Edge CMOS Devices in the 65 nm Generation Hybrid Low Dielectric Constant Film Structure copper Wiring Module Reduced Wiring Capacitance and Supports Fine Fabrication. Sony CX–News vol. 33.

R. Kanamura, Y. Ohnka, M. Fukasawa, K. Tabuchi, K. Nagahata, S. Shibaki, M. Maramatsu, H. Miyajima, T. Usul, A. Kajita, H. Shibata, and S. Kadomura; Integration of Cu/low–k Dual–Damascene Interconnects with a Porous PAE/SIOC Hybrid Structure for 65am–node High Performance eDram 2003 Symposium on VLSI Tech. pp. 107–108.

* cited by examiner

Primary Examiner—Matthew Smith
Assistant Examiner—B. V. Keshavan
(74) Attorney, Agent, or Firm—James J. Cioffi; Cantor Colburn LLP

(57) ABSTRACT

A method for implementing dual damascene processing includes forming a first hardmask layer over an interlevel dielectric layer, and forming a second hardmask layer over the first hardmask layer. A trench pattern is opened within a third hardmask layer formed over the second hardmask. A first etch process is implemented so as to define a via pattern completely through the second hardmask layer and partially through the first hardmask layer, and a second etch process is implemented to transfer the trench pattern and the via pattern into the interlevel dielectric layer.

16 Claims, 2 Drawing Sheets

METHOD FOR REACTIVE ION ETCH PROCESSING OF A DUAL DAMASCENE STRUCTURE

BACKGROUND OF INVENTION

The present invention relates generally to semiconductor device processing, and, more particularly, to a method for reactive ion etch processing of dual damascene structures formed in porous dielectric materials.

In the fabrication of integrated circuit devices, it is often desirable to isolate individual components of the integrated circuits from one another with insulative materials. Such insulative materials may include, for example, silicon dioxide, silicon nitride and silicon carbide. While these materials may have acceptable insulating properties in many applications, they also have relatively high dielectric constants, which can lead to capacitive coupling between proximate conductive elements. This is particularly disadvantageous, given the ever-decreasing distances between conductive circuit elements, and the use of multi-layered structures. An unnecessary capacitive coupling between adjacent wires increases the RC time delay of a signal propagated therethrough, resulting in decreased device performance.

Thus, for specific applications, insulating materials having relatively low dielectric constants (e.g., k<3) are desired. In very large scale integrated circuit (VLSI) technology, silicon dioxide ($SiO_2$) has been traditionally used as an interlevel dielectric (ILD) material in conjunction with aluminum interconnect material. More recently, however, significant advancements have been made to enhance circuit performance by replacing the $SiO_2$ with a "low-k" dielectric and by using copper (higher conductivity) interconnect.

Organic materials or materials of low density used as low-k dielectrics are frequently etched when the resist is stripped from the wafer. This results in vias being etched too deeply or completely etched to a sub-film before the resist is removed. To overcome this drawback, a dual damascene reactive ion etch (RIE) process is split into two discrete steps where the vias are etched first, followed by the trench definition. The reverse of this process is also used, wherein the trench pattern is etched prior to the vias. In either case, however, stripping of the resist presents problems of depth and profile control.

Furthermore, organosilciate (OSG) type materials used as dielectrics are sensitive to wet cleaning steps, such as a dilute hydrofluoric acid (DHF) rinse. For example, a porous OSG film has been shown to etch in DHF solutions. In addition, the absorption of liquid matter in the pores of the dielectric can pose a major problem to the liner integrity. Accordingly, it would be desirable to be able to implement a damage free etch process that isolates the dielectric layer from resist stripping steps, while also controlling etch rate of the dielectric layer and maintaining a robust processing window.

SUMMARY OF INVENTION

The foregoing discussed drawbacks and deficiencies of the prior art are overcome or alleviated by a method for implementing dual damascene processing. In an exemplary embodiment, the method includes forming a first hardmask layer over an interlevel dielectric layer, and forming a second hardmask layer over the first hardmask layer. A trench pattern is opened within a third hardmask layer formed over the second hardmask. A first etch process is implemented so as to define a via pattern completely through the second hardmask layer and partially through the first hardmask layer, and a second etch process is implemented to transfer the trench pattern and the via pattern into the interlevel dielectric layer.

In another embodiment, a method for implementing dual damascene processing for a semiconductor device includes forming a first hardmask layer over an interlevel dielectric layer and forming a second hardmask layer over the first hardmask layer. A trench pattern is opened within a third hardmask layer formed over the second hardmask. A first etch process is implemented so as to define a via pattern completely through the second hardmask layer and partially through the first hardmask layer. A photoresist layer used to create the via pattern is stripped, and a second etch process is then implemented to transfer the trench pattern and the via pattern into the interlevel dielectric layer.

BRIEF DESCRIPTION OF DRAWINGS

Referring to the exemplary drawings wherein like elements are numbered alike in the several Figures.

DETAILED DESCRIPTION

Disclosed herein is a processing scheme in which an organic or low density, low-k dielectric film is provided with additional hardmask layers thereupon, such that the lower hardmask layer is direct contact with the dielectric is only partially etched therethrough during initial via/trench definition. In this manner, a photoresist material may be stripped without exposing the low-k material to the removal process. Thereafter, the remaining lower hardmask layer is removed, and a different etch chemistry is employed for completing the via and trench definition within the dielectric layer, down to a cap layer thereunderneath.

Figure 1A:
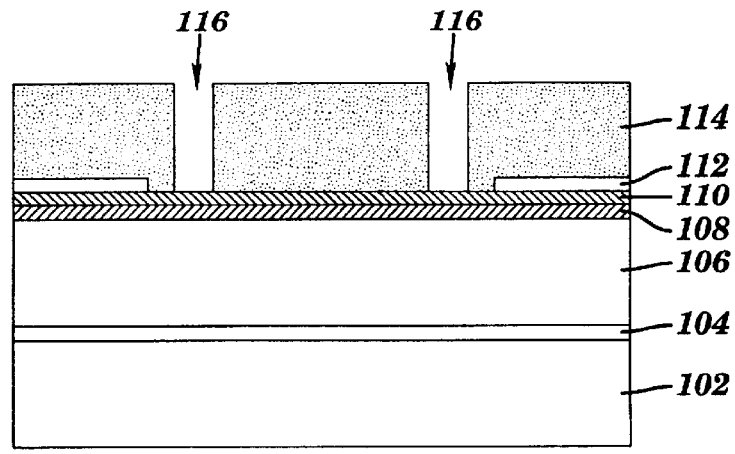
FIGS. 1(a) through 1(f) are cross sectional views illustrating a method for implementing dual damascene processing, in accordance with an embodiment of the invention.

Referring initially to FIG. 1(a), there is shown a cross sectional view of a wafer film stack of a semiconductor device having patterned resist for vias in the trench region of a previously etched tantalum nitride (TaN) hardmask. More particularly, a lower layer 102 (e.g., a substrate or lower level metallization layer) has a cap layer 104 (e.g., silicon nitride, silicon carbide) formed thereon, followed by a dielectric layer 106. The dielectric layer 106 may be an organic, low-k material such as SiLK® or porous OSG, for example. Then, a first hardmask layer 108 is formed directly over the dielectric layer 106, followed by a second hardmask layer 110 formed over the first hardmask layer 108. In an exemplary embodiment, the first hardmask layer 108 may be a low-k dielectric barrier such as BLOk™, while the second hardmask may be silicon nitride (SiN), for example.

In addition, a third hardmask layer 112, such as tantalum nitride (TaN) for example, is formed over the second hardmask layer 110. In FIG. 1(a), the TaN hardmask layer 112 is shown opened in accordance with a metal trench pattern defined in accordance with dual damascene processing. A layer of photoresist material 114 is further formed over the TaN hardmask layer 112 and exposed portions of the second hardmask layer 110, after which a pair of via openings 116 are patterned within the photoresist 114.

Figure 1B:
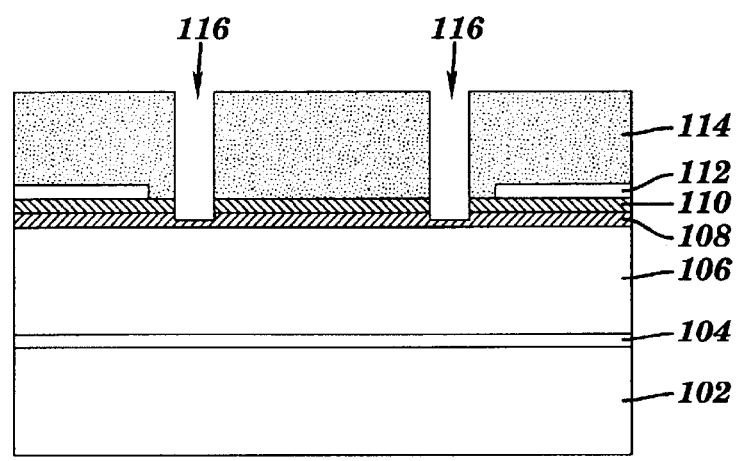

As shown in FIG. 1(b), a first etch process is used to transfer the via pattern completely through the SiN second hardmask layer 110, and an associated antireflective coating layer (not shown). Once completely through the second hardmask layer 110, the first etch process continues to partially etch through the thickness of the first hardmask layer 108. In an exemplary embodiment, the first etch process etches through at least about 50% of the thickness of the first hardmask layer 108, and more preferably through at least about 60% of the thickness. In order to control the partial etching of the first hardmask layer, the etch chemistry of the first etch process is preferably selected such that the second hardmask layer 110 etches at a faster rate than the first hardmask layer 108.

Figure 1C:
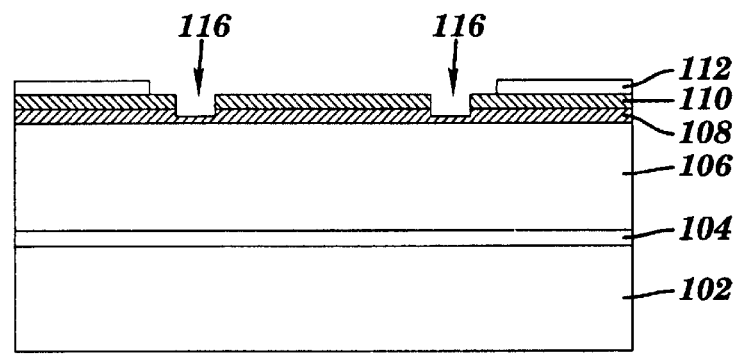

Once the desired amount of the first hardmask layer 108 is removed, the photoresist layer 114 is stripped as shown in FIG. 1(c), and the wafer may be wet-cleaned with a DHF rinse, for example. Because there is still a remaining thickness of the first hardmask layer 108, the dielectric layer 106 underneath is not subjected to the stripping/rinse chemistry. Thus, a dielectric material having a high etch rate in DHF, such as porous OSG (p-OSG), is undamaged as a result of the resist stripping and cleaning environment.

Figure 1D:
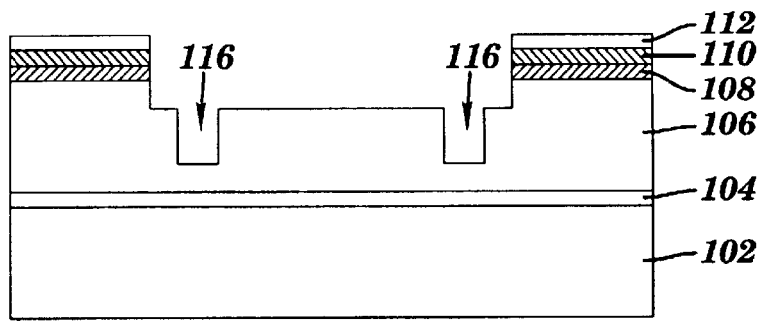

Then, as shown in FIG. 1(d), a second etch process is commenced so as to transfer both the predefined trench and via patterns into the dielectric layer 106. The chemistry and plasma conditions of the second etch process are (different etch rate/different gasses not selective to blok, but faster). During this etch, the newly exposed (and previously unetched portions) of the second and first hardmask layers begin to be removed (i.e., the trench hardmask open process). However, before those portions are completely removed, the via pattern will first clear through the previously thinned portions of first hardmask layer 108. Once this occurs, the via pattern will then accelerate into the dielectric layer 106, due to its faster etch rate. By the time the second and first hardmask layers 110, 108 exposed by the trench pattern are completely removed, the vias 116 formed in dielectric layer 106 are already about 60% or more through the total thickness thereof.

Figure 1E:
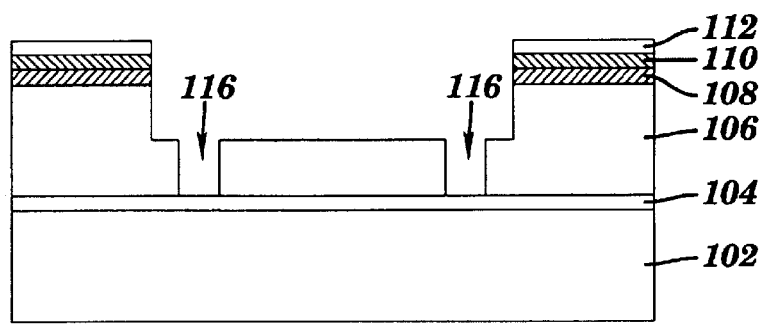
Figure 1F:
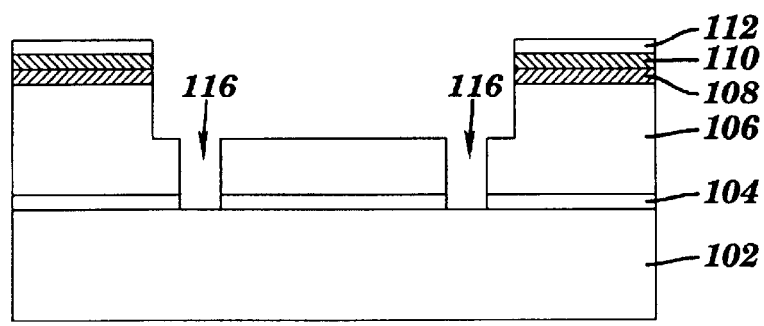

Accordingly, when the trench pattern reaches the dielectric, the etch rate thereof will be the same as the increased etch rate of the via 116. The second etch process is completed once the cap layer 104 is reached, as shown in FIG. 1(e). The accelerated etch rate of the trench pattern into the dielectric material for the remaining time taken for the via depth to reach the cap layer 104 results in a desired trench depth of about 35% to about 40% of the overall thickness of the dielectric layer 106. Finally, in FIG. 1(f), the cap layer 104 is etched to allow electrical connection to the lower level layer 102. Another DF cleaning step can be performed in a non-damaging environment, such as Ar/$H_2$, before the trench and vias are filled with conductive materials and thereafter planarized in accordance with established damascene processing techniques.

As will be appreciated, the above described approach to defining dual damascene trench and via patterns within a porous, low-k dielectric (or OSG) material is advantageous in that a non-damaging resist removal process may be implemented within an integrated, single chamber RIE processing tool. In other words, the techniques described herein provide a significant cost advantage over existing non-damaging resist removal processes (or, alternatively damage recovery processes) such as applying an He/$H_2$ downstream plasma in a separate plasma processing tool, silation, and annealing for example.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing dual damascene processing, the method comprising:
    forming a first hardmask layer over an interlevel dielectric layer;
    forming a second hardmask layer over said first hardmask layer;
    opening a trench pattern within a third hardmask layer formed over said second hardmask;
    implementing a first etch process so as to define a via pattern completely through said second hardmask layer and partially through said first hardmask layer; and
    implementing a second etch process to transfer said trench pattern and said via pattern into said interlevel dielectric layer.

2. The method of claim 1, wherein said interlevel dielectric layer is selected from a material having a faster etch rate with respect to said first and said second hardmask layers.

3. The method of claim 2, wherein said interlevel dielectric layer further comprises an organic, low-k material.

4. The method of claim 2, wherein said interlevel dielectric layer further comprises a porous, organosilciate (OSG) type material.

5. The method of claim 1, wherein said first etch process is implemented with a first etch chemistry such that said second hardmask layer etches at a faster rate with respect to said first hardmask layer.

6. The method of claim 5, wherein said first hardmask layer comprises a low-k dielectric barrier, and said second hardmask comprises silicon nitride.

7. The method of claim 1, wherein said second etch process is implemented with a second etch chemistry such that said second hardmask layer etches at about an equal rate with respect to said first hardmask layer.

8. A method for implementing dual damascene processing for a semiconductor device, the method comprising:
    forming a first hardmask layer over an interlevel dielectric layer;
    forming a second hardmask layer over said first hardmask layer;
    opening a trench pattern within a third hardmask layer formed over said second hardmask;
    implementing a first etch process so as to define a via pattern completely through said second hardmask layer and partially through said first hardmask layer;
    stripping a photoresist layer used to create said via pattern; and
    following said stripping, implementing a second etch process to transfer said trench pattern and said via pattern into said interlevel dielectric layer.

9. The method of claim 8, wherein said interlevel dielectric layer is selected from a material having a faster etch rate with respect to said first and said second hardmask layers.

10. The method of claim 9, wherein said interlevel dielectric layer further comprises an organic, low-k material.

11. The method of claim 9, wherein said interlevel dielectric layer further comprises a porous, organosilciate (OSG) type material.

12. The method of claim 8, wherein said first etch process is implemented with a first etch chemistry such that said second hardmask layer etches at a faster rate with respect to said first hardmask layer.

13. The method of claim 12, wherein said first hardmask layer comprises a low-k dielectric barrier, and said second hardmask comprises silicon nitride.

14. The method of claim 8, wherein said second etch process is implemented with a second etch chemistry such that said second hardmask layer etches at about an equal rate with respect to said first hardmask layer.

15. The method of claim 14, wherein during said second etch said via pattern is extended by at least about 60% into the thickness of said interlevel dielectric layer at a point when exposed portions of said first and said second hardmask layers are completely removed.

16. The method of claim 15, wherein a resulting trench depth formed in said interlevel dielectric layer is about 35% to about 40% of said thickness of said interlevel dielectric layer once said via pattern reaches a cap layer beneath said interlevel dielectric layer.

* * * * *